United States Patent [19]
Toyoshima

[11] Patent Number: 4,935,379
[45] Date of Patent: Jun. 19, 1990

[54] SEMICONDUCTOR DEVICE AND METHOD OF MANUFACTURING THE SAME

[75] Inventor: Yoshiaki Toyoshima, Matsudo, Japan

[73] Assignee: Kabushiki Kaisha Toshiba, Kawasaki, Japan

[21] Appl. No.: 319,873

[22] Filed: Mar. 1, 1989

Related U.S. Application Data

[63] Continuation of Ser. No. 81,629, Aug. 3, 1987, abandoned, which is a continuation of Ser. No. 806,807, Dec. 10, 1985, abandoned.

[30] Foreign Application Priority Data

Dec. 27, 1984 [JP] Japan .................. 59-278225
Mar. 15, 1985 [JP] Japan .................. 60-51721

[51] Int. Cl.$^5$ ........................... H01L 21/265
[52] U.S. Cl. ........................... 437/44; 437/41; 437/157; 357/23.3; 357/23.4
[58] Field of Search .................. 437/34, 40, 41, 44, 437/157, 186, 56, 57; 357/23.3, 23.4, 23.9, 23.11, 54; 156/643

[56] References Cited

U.S. PATENT DOCUMENTS

| 4,080,618 | 7/1969 | Tango et al. ............ 357/23.9 |
| 4,172,260 | 2/1972 | Okabe et al. ........... 357/23.8 |
| 4,342,149 | 8/1982 | Jacobs et al. ............ 437/44 |
| 4,356,623 | 11/1982 | Hunter ..................... 437/44 |
| 4,382,826 | 5/1983 | Pfleiderer et al. ......... 437/44 |
| 4,402,761 | 9/1983 | Feist ........................ 357/23.9 |
| 4,442,591 | 4/1984 | Haken ....................... 437/57 |
| 4,514,897 | 5/1985 | Chiu et al. ............... 357/23.9 |
| 4,590,663 | 5/1986 | Haken ....................... 437/34 |
| 4,649,629 | 3/1987 | Miller et al. ............. 437/44 |
| 4,680,603 | 7/1987 | Wei et al. ................ 437/44 |
| 4,691,433 | 9/1987 | Pimbley et al. .......... 437/44 |
| 4,703,551 | 11/1987 | Szluk et al. ............. 437/44 |
| 4,735,914 | 4/1988 | Hendrickson et al. ...... 437/44 |
| 4,746,624 | 5/1988 | Cham et al. ............. 437/44 |

FOREIGN PATENT DOCUMENTS 0136376  7/1985  Japan .

OTHER PUBLICATIONS

IEEE Journal of Solid-State Circuits, vol. SC-17, No. 2, Apr. 1982, pp. 220-226, New York, U.S.; P. J. Tsang et al.: "Fabrication of High-Performance LDDFETs w/Oxide Sidewall-Spacer Tech.".
IEEE Trans. on Elec. Dev., vol. ED-27, pp. 1359-1367, Aug. 1980, Ogura et al., "Design and Characteristics of the Lightly Doped Drain-Source (LDD) Insulated Gate Field-Effect Transistor".
IEEE Electron Device Lett., vol. EDL-5, p. 71, Mar. 1984, Hsu et al., "Structure-Enhanced MOSFET Degradation Due to Hot Electron Injection".

Primary Examiner—Brian E. Hearn
Assistant Examiner—M. Wilczewski
Attorney, Agent, or Firm—Oblon, Spivak, McClelland, Maier & Neustadt

[57] ABSTRACT

The invention provides a semiconductor device and manufacturing method therefor which comprises: a semiconductor substrate of a first conductivity type, source and drain regions of a second conductivity type provided on the surface of the substrate in a mutually electrically isolated arrangement, and a gate electrode provided on the surface of the substrate on the other side of an insulating film and the substrate surface including a channel region between these aforementioned regions; at least the drain region, of which the source and drain regions, consisting of: a first impurity diffusion region provided on the substrate surface in the vicinity of the end portion of the gate electrode; a second impurity diffusion region more highly doped than the first impurity diffusion region and provided in at least a portion of the surface of the aforementioned diffusion region adjacent the end portion of this first impurity diffusion region; and a third impurity diffusion region more highly doped than the second impurity diffusion region and provided on the substrate surface adjacent to the end portion of this second impurity diffusion region.

4 Claims, 7 Drawing Sheets

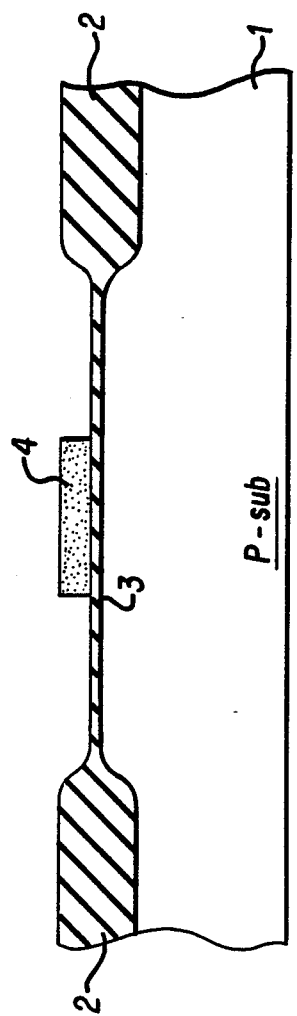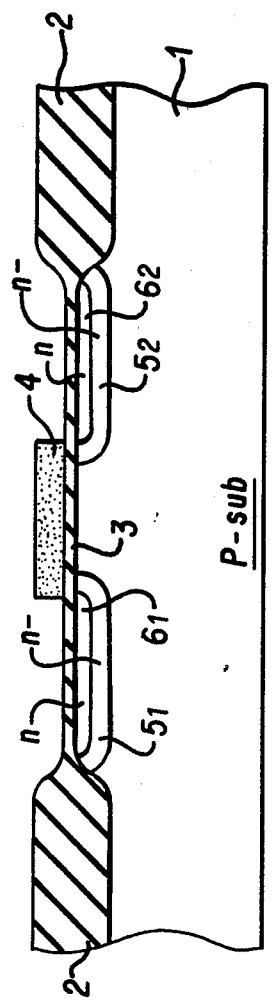

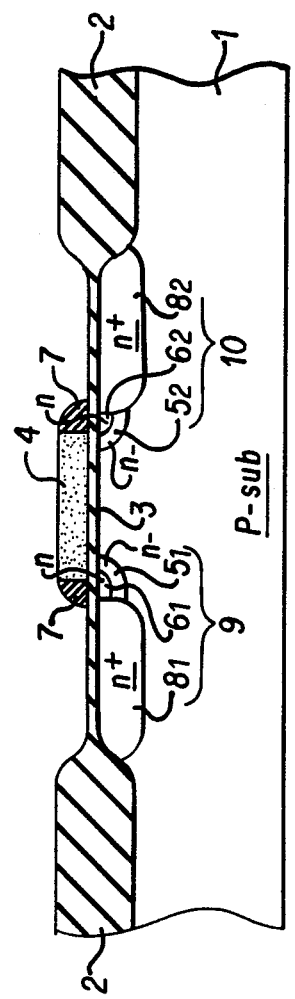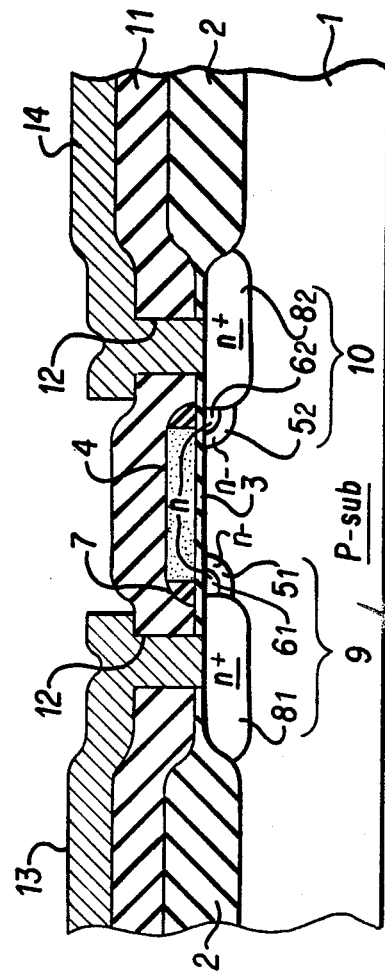

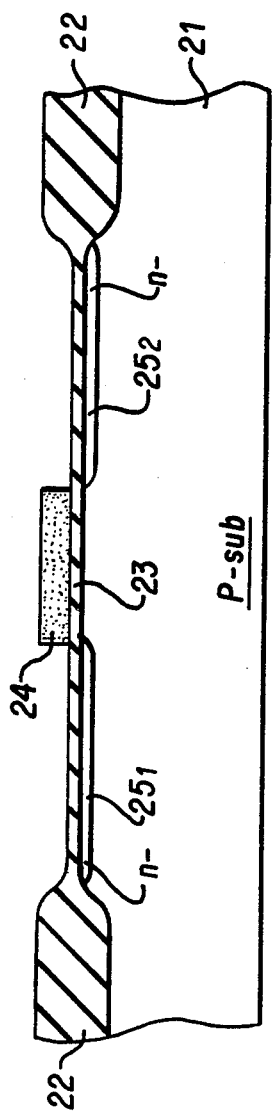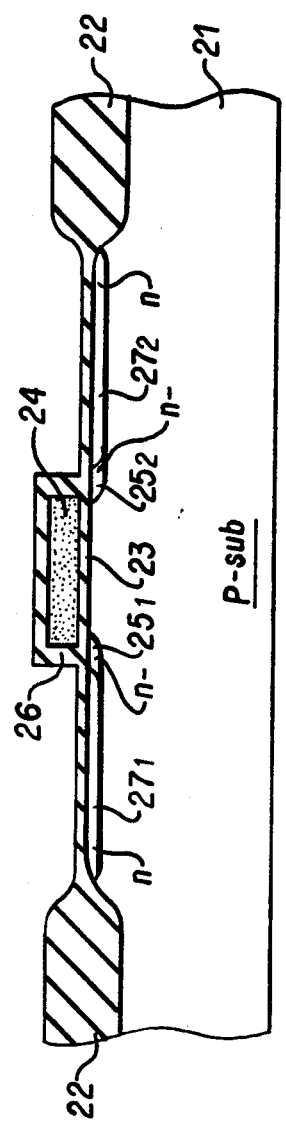
FIG. 6
FIG. 7

SEMICONDUCTOR DEVICE AND METHOD OF MANUFACTURING THE SAME

This application is a continuation of application Ser. No. 081,629, filed on August 3, 1987, now abandoned, which is a continuation of application Ser. No. 806,807, filed on December 10, 1985, now abandoned.

BACKGROUND OF THE INVENTION (1) Field of the Invention

This invention relates to a semiconductor devices and in particular to an MIS type semiconductor device comprising a drain region of improved structure.

(2) Description of the Prior Art

Recently, the so-called LDD (lightly doped drain) structure of the drain region has been developed. This is a two-layer structure consisting of lightly doped and heavily doped impurity diffusion regions, and was developed as a means of promoting a high degree of circuit integration of MIS type semiconductor devices (e.g. MOS type semiconductor integrated circuits), and of increasing their breakdown voltage. This is achieved by lowering the strength of the high electric field set up in the vicinity of the drain region as a result of the miniaturization of such transistors.

However, while the lightly doped impurity diffusion region suppresses formation of hot carriers by lowering the electric field near the drain junction, the surface of the lightly doped impurity region easily becomes depleted by the electric field set up in the insulating films such as the gate insulating film by the action of the surface state or the trapped charges induced by hot carriers. This in turn results in an increase in the parasitic resistance due to the lightly doped impurity region, with the result that the current drive capacity of transistors of LDD structure undergoes a characteristic deterioration. The drain electric field lowering effect in the LDD structure increases with decreasing concentration of the dopant in the lightly doped impurity diffusion region, but the aforementioned characteristic deterioration also increases with decreasing concentration of the dopant and this produces the problem that the range within which the dopant concentration of the lightly doped impurity region can be selected is restricted by these mutually opposed requirements.

SUMMARY OF THE INVENTION

An object of this invention is to provide a high-performance MIS type semiconductor device of high reliability with LDD structure, wherein the drain electric field strength lowering effect of the lightly doped impurity region is maintained but lowering of the current drive capacity due to an increase in the parasitic resistance produced by the diffusion region is prevented.

The invention is characterized by a structure comprising a semiconductor substrate of first conductive type; source and drain regions of a second conductive type, provided in a mutually electrically isolated arrangement in the surface of substrate; a gate electrode, provided on the surface of the substrate, on the other side of an insulating film, which the surface of the substrate includes a channel region between these regions; a first impurity diffusion region provided on the substrate surface, and wherein, of the source and drain regions, at least the drain region is positioned in the vicinity of the end portion of the gate electrode; a second impurity diffusion region provided in at least part of a surface adjacent the end portion of the first impurity diffusion region and having a higher concentration than the first impurity diffusion region; and a third impurity diffusion region provided on the substrate surface, at a position adjacent the end portion of this second impurity diffusion region and having a higher concentration than the second impurity region.

In this manner, the invention makes it possible to obtain high-performance MIS type semiconductor devices of high reliability, wherein the drain electric field lowering effect of the lightly doped impurity diffusion region of the LDD structure is maintained but the lowering of the current drive capacity due to increased parasitic resistance produced by the diffusion region is prevented.

BRIEF DESCRIPTION OF THE DRAWINGS

Other objects and advantages of the invention will become apparent from the following detailed description when taken in conjunction with the accompanying drawings, in which:

FIGS. 1 to 4 are cross-sectional views illustrating the process for manufacturing an embodiment of an n-channel MIS type semiconductor device of LDD structure according to this invention;

FIGS. 6 to 9 are cross-sectional views illustrating the manufacturing method of another embodiment of the n-channel MIS type semiconductor device according to this invention.

DESCRIPTION OF THE PREFERRED EMBODIMENTS

Figure 5:
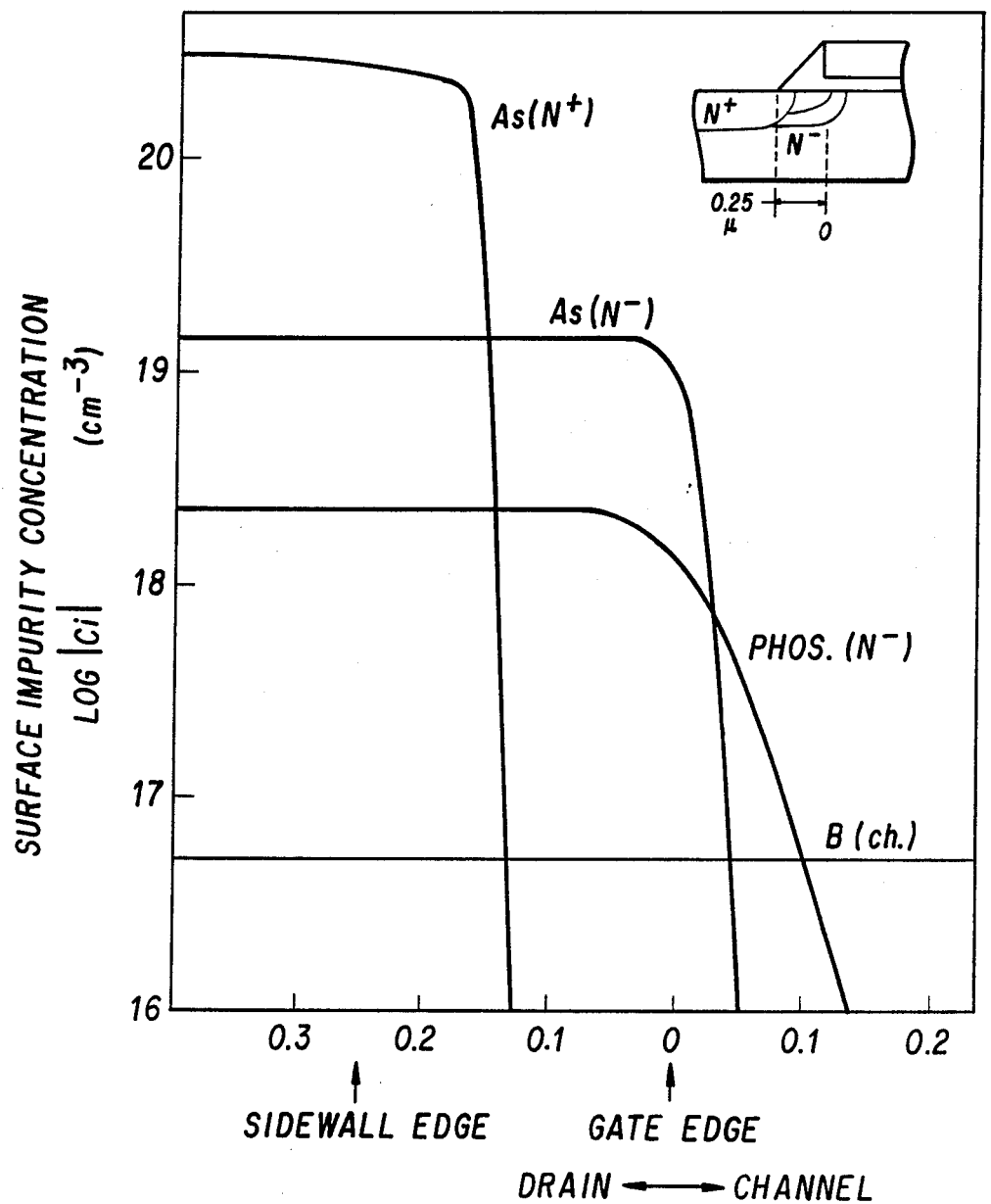
FIG. 5 is a graph showing the doping profile at the boundary surface between the gate oxide film and the diffusion layer.

An embodiment of an n-channel MOS transistor having an LDD structure according to this invention will be described below together with its method of manufacture, with reference to FIGS. 1 to 4.

As shown in FIG. 1, a field oxide film of 7000 Angstrom thickness is first produced on a p type silicon substrate 1 by the method of local oxidation, followed by thermal oxidation treatment to form a gate oxide film 3 of 250 Angstrom thickness on substrate 1, separated from the field oxide film 2 and forming an island. A polycrystalline silicon film of 4000 Angstrom thickness is then deposited over the whole surface, a phosphorus diffusion carried out in a $POCl_3$ atmosphere to P-dope the polycrystalline silicon film, thus lowering its resistance, after which patterning is performed by the photo lithography technique to form gate electrode 4.

Next, as shown in FIG. 2, using the field oxide layer 2 and gate electrode 4 as a mask, and applying an accelerating voltage of 40 keV, phosphorus, which has a comparatively large diffusion coefficient, was introduced by ion implantation in a dose of $2 \times 10^{14}$ ions $cm^{-2}$, followed by ion implantation of arsenic, which has a comparatively small diffusion coefficient, in a dose of $1 \times 10^{14}$ ions $cm^{-2}$, by applying an accelerating voltage of 30 keV. This was followed by the activation of the lightly doped $n^-$ type diffusion regions (first diffusion regions) $5_1$ and $5_2$, self-aligned with respect to the gate electrode 4 on the substrate 1, and formation of the n type diffusion regions (second diffusion regions) $6_1$ and $6_2$, which are more highly doped than the diffusion regions $5_1$ and $5_2$.

As shown in FIG. 3 a SiO2 film of 2000 Angstrom thickness was then deposited over the whole surface and the whole surface was then etched by the reactive ion etching method forming a wall member 7 on the lateral face of the gate electrode 4. The field oxide film 2, the gate electrode 4 and the wall member 7 were then used as mask and arsenic ions were implanted in a dose of $5\times10^{15}$ ions cm$^{-2}$, using an accelerating voltage of 40 keV. This was followed by activation involving heat treatment for 60 minutes at 900° C., and the n+ type diffusion regions (third diffusion regions) $8_1$ and $8_2$, which are more highly doped than the n type diffusion regions $6_1$ and $6_2$, were then formed in a self-alignment manner with respect to the wall member 7, on the surface of the substrate 1. The different diffusion regions may be activated either individually or all together. In this way, the source region 9 is formed from the n$^-$ type diffusion region $5_1$, the n type diffusion region $6_1$ and the n+ type diffusion region $8_1$, and the drain region 10 from the n$^-$ type diffusion region $5_2$, the n type diffusion region $6_2$, and the n+ type diffusion region $8_2$.

As shown in FIG. 4 a CVD-SiO2 film 11 was then deposited on the whole surface, contact holes 12 were formed in the CVD-SiO2 film 11 and the gate oxide film 3 by photoetching and this was followed by formation of an aluminium film by evaporation, carrying out patterning to form the aluminium distribution wires 13 and 14, connecting the source region 9 and the drain region 10 via the contact holes 12. In this manner an n-channel MOS transistor was produced.

FIG. 5 shows a graph of the concentration of impurities at the interface between the gate oxide film and the diffusion layer (ordinate) vs, the position from the gate edge on the semiconductor substrate surface (abscissa).

MOS transistors according to the invention thus have an LDD structure as illustrated in FIG. 4, comprising a source region 9 and a drain region 10, consisting of n$^-$ type diffusion regions $5_1$ and $5_2$ provided in the surface of the substrate 1 at positions close to the end portions of the gate electrode 4, n type diffusion regions $6_1$ and $6_2$, having a higher concentration than the diffusion regions $5_1$ and $5_2$, provided on the surface of substrate 1 at positions separated from the end portions of the gate electrode 4, the n type diffusion regions $6_1$ and $6_2$ having higher concentrations than the n$^-$ type diffusion regions $5_1$ and $5_2$, and n+ type diffusion regions $8_1$ and $8_2$ which have a higher concentration than the n type diffusion regions $6_1$ and $6_2$. Formation of hot carriers by the n$^-$ type diffusion region $5_2$ of the drain region 10 can thus be prevented by a lowering of the drain electric field strength.

Furthermore, the influence of an electric field set up in the gate oxide film 3 by the action of the surface state or trapped chrages induced by hot carriers which would lead to depletion of the n$^-$ type diffusion region $5_2$ can be prevented by provision of n type diffusion region $6_2$ on its surface and this in turn makes it possible to overcome the problem of a lowering of the electric field drive capacity.

The conditions applied for the formation of the n$^-$, n and n+ type impurity diffusion regions (first, second and third diffusion regions) are not limited to the above embodiment, but may be varied freely provided they remain within a range making it possible to attain the objects of the invention.

The embodiment discussed above relates to an n-channel MOS transistor, but this invention is equally applicable to p-channel MOS transistors, CMOS transistors or to other MIS type transistors such as MNOS and the like, in which materials other than oxide films are used as gate insulating films.

A second embodiment of the invention applied to an n-channel MOSIC will be explained in conjunction with a manufacturing method therefor as illustrated in FIG. 6 to FIG. 9.

As shown in FIG. 6 a field oxide film 22 is first formed by local oxidation on a p type silicon substrate 21. Thermal oxidation treatment is then carried out, forming a gate oxide film 23 of 250 Angstrom thickness in the shape of an island on the substrate 21. A polycrystalline silicon film of 4000 Angstrom thickness is the built up over the whole surface. This is doped with phosphorus by phosphorus diffusion in a POCl3 atmosphere to lower its resistance and a gate electrode 24 is formed by patterning using a photo lithography technique. Using the gate electrode 24 as a mask, phosphorus ions are implanted in a dose of $2\times10^{13}$ cm$^{-2}$, using an accelerating voltage of 35 keV, to bring about activation, n$^-$ type diffusion regions (first diffusion regions) $25_1$ and $25_2$, are then formed on the surface of the substrate 21 in a self-aligned manner with respect to the gate electrode 24.

As shown in FIG. 7 a thermal oxidation treatment is now carried out, forming an oxide film of 1000 Angstrom thickness (first wall member) 26 on the top and lateral faces of the gate electrode 24, consisting of polycrystalline silicon. Next, the gate electrode 24 and the oxide film 26 are used as mask and arsenic ions which have a comparatively small diffusion coefficient are then implanted in a dose of $1\times10^{14}$ cm$^{-2}$ applying an accelerating voltage of 35 keV, bringing about activation, forming the n type diffusion regions $27_1$ and $27_2$, having a higher concentration than the aforementioned diffusion regions $25_1$ and $25_2$, in the surface of the substrate 21, in a manner self-aligned with respect to the first wall member 26.

Figure 8:
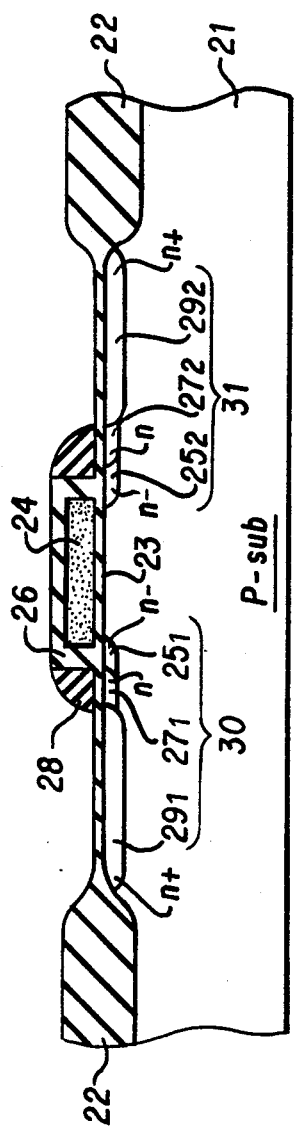

As shown in FIG. 8 a SiO2 film of 2000 Angstrom thickness was then deposited over the whole surface and the whole surface was then etched by the reactive ion etching method forming a second wall member 28 on the lateral face of the first wall member 26 formed on the lateral face of the gate electrode 24. The field oxide film 22, the gate electrode 24, the oxide film 26 and the second wall member 28 were then used as mask and arsenic ions were implanted in a dose of $5\times10^{15}$ ions cm$^{-2}$, using an accelerating voltage of 40 keV. This was followed by activation involving heat treatment for 60 minutes at 900° C., and the n+ type diffusion regions (third diffusion regions) $29_1$ and $29_2$, which are more highly doped than the n type diffusion regions $27_1$ and $27_2$, were then formed in a self-alignment manner with respect to the second wall member 28, in the surface of the substrate 21. This gives a source region 30 comprising the n$^-$ type diffusion regions $25_1$, the n type diffusion region $27_1$, and the n+ type diffusion region $29_1$, and a drain region 31, comprising the n$^-$ type diffusion region $25_2$, the n type diffusion region $27_2$, and the n+ type diffusion region $29_2$.

Figure 9:
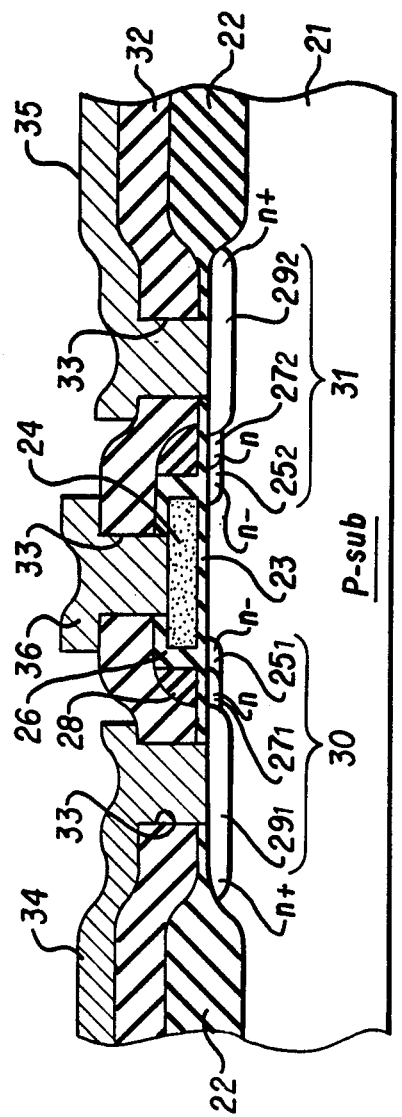

As shown in FIG. 9 a CVD film 32 is next deposited over the whole surface, contact holes 33 are then formed in this film 32 and in the gate oxide film 3 by a photoetching technique, and aluminium distribution wires 34, 35 and 36, which connect the n+ type diffusion regions $29_1$ and $29_2$ of the source and drain regions 30 and 31, and the gate electrode 24 via the contact holes 33, thus producing an n-channel MOSIC device, are formed by evaporation and patterning of the Al film.

Accordingly, in the MOSIC according to the invention, an LDD structure is produced by providing a first wall member (oxide film) 26 and a second wall member 28 of different thickness on the lateral faces of the gate electrode 24, and on the surface of the p type silicon substrate 21 n$^-$ type diffusion regions (first diffusion regions) 25$_1$ and 25$_2$, n type diffusion regions (second diffusion regions) 27$_1$ and 27$_2$, and n$^+$ type diffusion regions (third diffusion regions) 29$_1$ and 29$_2$, in a self-aligned manner with respect to the gate electrode 24, the first wall member 26 and the second wall member 28, diffusion regions 25$_1$, 27$_1$, 29$_1$ forming the source region 30 and diffusion regions 25$_2$, 27$_2$ and 29$_2$ forming the drain region 31, thus producing an LDD structure, as illustrated in FIG. 9. This structure makes it possible to lower the drain electric field strength thus preventing formation of hot carriers by the action of the n$^-$ type diffusion region 25$_2$ of the drain region 31. Likewise, depletion of the n$^-$ type diffusion region 25$_2$ due to the influence of the electric field set up in the gate oxide film 23 by the action of the surface state or trapped chrages induced by hot carriers can be reduced by the adjacent n type diffusion region 27$_2$ and this in turn suppresses the lowering of the power drive capacity.

Since the width of the n$^-$ and n type diffusion regions 25$_1$, 25$_2$, 27$_1$ and 27$_2$ is easily controlled by the first and second wall members 26 and 28, the aforementioned two mutually opposed problems can be solved and n$^-$ and n type diffusion regions (25$_1$, 25$_2$, 27$_1$ and 27$_2$) of suitable concentration and width can be formed.

In the embodiment discussed above, the source region(as well as the drain region) was formed from three diffusion regions of different concentration, but devices in which only the drain region consists of three diffusion regions of mutually different concentrations are also suitable.

The conditions applied when forming the three different types of diffusion regions (n$^-$, n and n$^+$ type diffusion regions) are not limited to those described above, but may be varied as desired provided they remain within a range making it possible to attain the objects of the invention.

Explanations given in the description of the above embodiments were based on an n-channel MOSIC, but they apply equally to CMOSIC or MNOS and the like MIS type ICs in which materials other than oxide are used as gate insulating films.

As described in detail above, this invention makes it possible to obtain high-performance MIS type semiconductor devices of high reliability by maintaining the drain electric field lowering effect exerted by the lightly doped diffusion regions of the LDD structure, while preventing the lowering of the current drive capacity produced by the increase in the parasitic resistance due to the diffusion regions.

Figure 10:
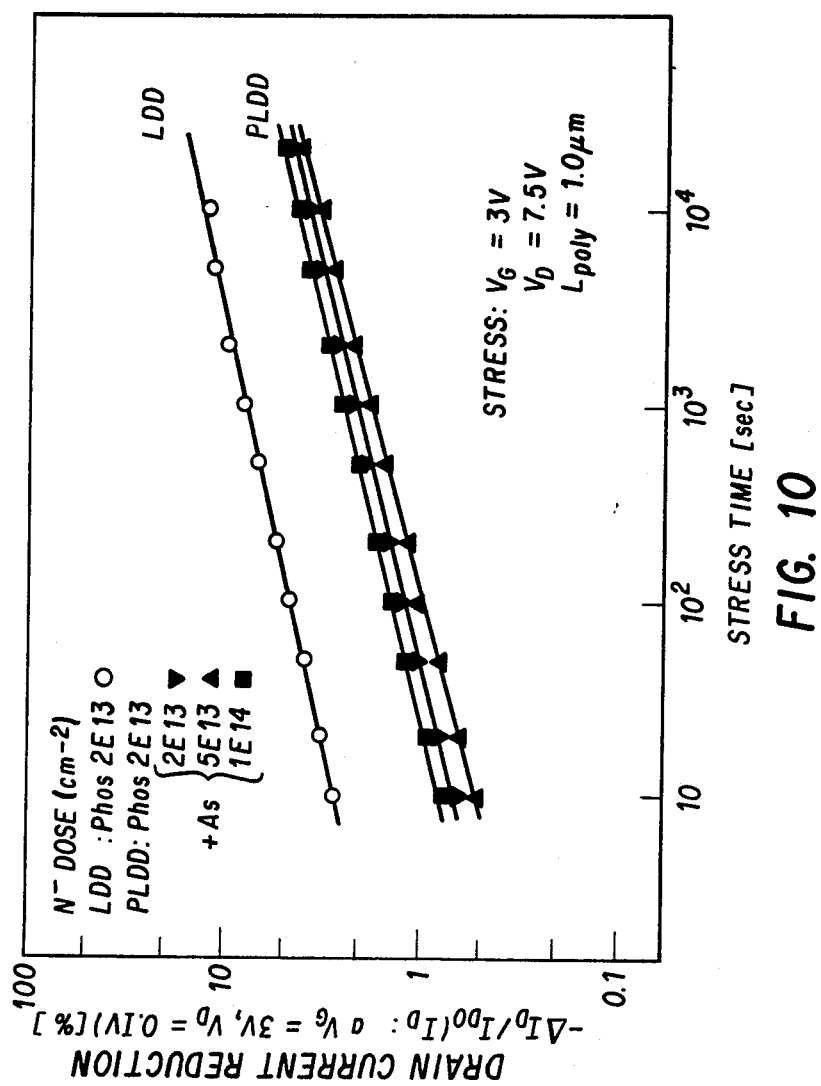
FIGS. 10 and 11 are graphs illustrating the effect of this invention.

A comparison of the process of the invention with conventional techniques will now be made with the aid of FIG. 10 and FIG. 11. In FIG. 10, the stress time, which is the accumulated time for all the intervals, is plotted along the abscissa and the drain current reduction (percentage change) along the ordinate. The measuring conditions employed to obtain this graph are given below. The stress conditions were that DC current biases were applied as follows: gate voltage VG=3 V, drain voltage VD=7.5 V and substrate voltage=0 V. This DC current bias due to this stress condition is applied to the device for a specified time, for example 10 seconds, 20 seconds and so forth. And for every accumulated stress time, the drain current reduction is measured under the condition of applying gate voltage of 3 V, a drain voltage of 0.1 V, and a substrate voltage of 0 V. The adverse effect represented by the drain current reduction increases in the direction of the ordinate i.e. upwards in the graph. In the Figure, the symbol LDD denotes a device with conventional LDD structure and PLDD a semiconductor device according to this invention. The dose of P ions implanted in the second diffusion layers was fixed as $2 \times 10^{13}$ cm$^{-2}$ and the As ion does introduced into the third diffusion layers at $2 \times 10^{13}$, $5 \times 10^{13}$, and $1 \times 10^{14}$ ions cm$^{-2}$ for the case where source and drain regions were formed. FIG. 10 clearly shows that the reduction of the drain current is significantly less than that shown by the conventional device.

Figure 11:
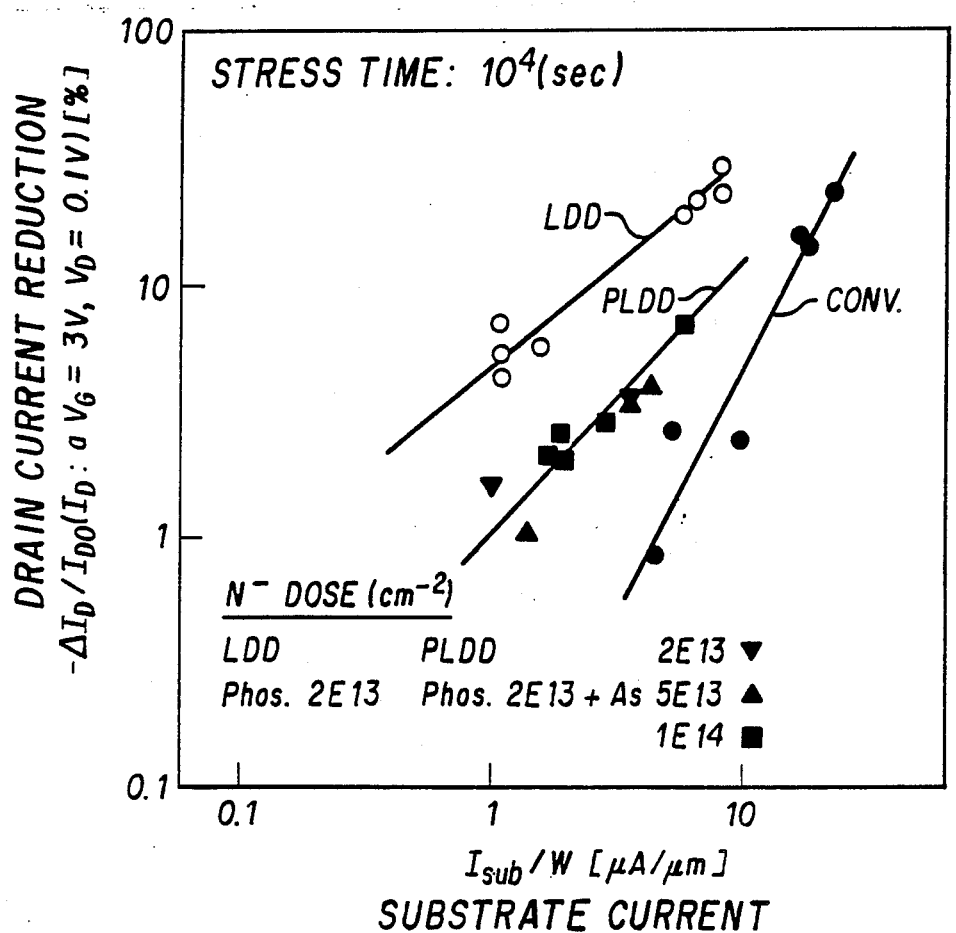

FIG. 11 shows the results of measuring the reduction in the drain current (percentage change) when varying the drain bias, fixing the stress time at 10$^4$ sec. In this graph, the substrate current/channel width (micro ampere/micrometer) under the condition of applying stress bias is plotted along the abscissa and the drain current reduction along the ordinate. The measurements were carried out using a channel width W=10 micrometers. In this Figure too, LDD signifies a semiconductor device of conventional structure and PLDD a semiconductor device according to this invention. CONV relates to a semiconductor device containing source and drain but with a conventional n$^+$ type diffusion region only. Hereinbelow these device are referred to respectively as LDD, PLDD and CONV. The dose of phosphorus implanted in the second diffusion layers of LDD and PLDD was $2 \times 10^{13}$ ions cm$^{-2}$ and the doses of arsenic ions implanted in the third diffusion layers of PLDD were $2 \times 10^{13}$, $2.5 \times 10^{13}$, and $1 \times 10^{14}$ ions cm$^{-2}$, these being the conditions used to form the source and drain regions. Here, the substrate current is equivalent to the amount of hot carriers formed. From FIG. 11, it is clearly seen that under conditions giving rise to formation of a given amount of hot carriers (same substrate current), the reduction shown by LDD is greater than that given by CONV. The semiconductor device PLDD according to this invention, however, gives a considerably decreased drain current reduction compared with LDD, for a given amount of hot carriers.

What is claimed is:

1. A method of manufacturing a semiconductor device, comprising the steps of:
   selectively forming a field insulating film on a semiconductor substrate of a first conductive type;
   forming a gate insulating film on said semiconductor substrate surface, followed by formation of a gate electrode;
   forming a first impurity diffusion region of a second conductive type in said semiconductor substrate surface, using said gate electrode as a mask using a relatively low dose of a first impurity of second conductive type;
   forming a second impurity diffusion region of a second conductive type, inside of the edge of said first impurity diffusion region using said gate electrode as a mask, and conductive type having a smaller diffusion coefficient than that of said first impurity;

forming an insulating film on the lateral surface of said gate electrode after the formation of said first and second impurity diffusion regions; and forming a third impurity diffusion region of a second conductive type having a higher concentration than said second impurity diffusion region using said insulating film as a mask.

2. A method of manufacturing a semiconductor device according to claim 1, wherein said gate electrode is made from a polycrystalline silicon film.

3. A method of manufacturing a semiconductor device according to claim 1, wherein said first impurity diffusion region is formed by activation by implantation of phosphorus ions.

4. A method of manufacturing a semiconductor device according to claim 3, wherein said second and third impurity diffusion regions are formed by activation by implantation of arsenic ions.

* * * * *